(12) United States Patent
Kawahara

(10) Patent No.: US 10,837,843 B2
(45) Date of Patent: Nov. 17, 2020

(54) VOLTAGE MEASURING SYSTEM

(71) Applicant: DENSO CORPORATION, Kariya (JP)

(72) Inventor: Shogo Kawahara, Kariya (JP)

(73) Assignee: DENSO CORPORATION, Kariya (JP)

( * ) Notice: Subject to any disclaimer, the term of this patent is extended or adjusted under 35 U.S.C. 154(b) by 196 days.

(21) Appl. No.: 16/300,072

(22) PCT Filed: Aug. 29, 2017

(86) PCT No.: PCT/JP2017/030926
§ 371 (c)(1),
(2) Date: Nov. 9, 2018

(87) PCT Pub. No.: WO2018/087992
PCT Pub. Date: May 17, 2018

(65) Prior Publication Data
US 2019/0154519 A1    May 23, 2019

(30) Foreign Application Priority Data
Nov. 9, 2016 (JP) .................................. 2016-218943

(51) Int. Cl.
| G01K 7/00 | (2006.01) |
| G01K 1/00 | (2006.01) |
| G01K 13/00 | (2006.01) |
| G01K 7/24 | (2006.01) |
| G01R 19/165 | (2006.01) |
| H01C 7/00 | (2006.01) |

(52) U.S. Cl.
CPC ......... G01K 7/24 (2013.01); G01R 19/16528 (2013.01); H01C 7/008 (2013.01)

(58) Field of Classification Search
USPC .......................... 374/183, 163, 100; 327/512
See application file for complete search history.

(56) References Cited

U.S. PATENT DOCUMENTS

| 7,322,743 | B2 * | 1/2008 | Gozloo | G01K 1/026 374/163 |
| 8,197,123 | B2 * | 6/2012 | Snyder | A61M 16/026 374/1 |
| 2014/0219316 | A1 * | 8/2014 | Tashiro | G01K 7/22 374/185 |
| 2015/0219503 | A1 | 8/2015 | Yoshida | |
| 2016/0003686 | A1 | 1/2016 | Matsumoto et al. | |
| 2019/0242759 | A1 * | 8/2019 | Hikosaka | H03G 1/0041 |

FOREIGN PATENT DOCUMENTS

| JP | H03-215723 A | 9/1991 |
| JP | H05-045232 A | 2/1993 |
| JP | 2010-228394 A | 10/2010 |
| JP | 2012-247218 A | 12/2012 |
| JP | 2015-200633 A | 11/2015 |

* cited by examiner

Primary Examiner — Mirellys Jagan
(74) Attorney, Agent, or Firm — Posz Law Group, PLC

(57) ABSTRACT

In a configuration for measuring a signal voltage by a voltage measuring unit through a multiplexer to which signals are inputted from a plurality of sensors including a thermistor, a series circuit which includes the thermistor, a driving resistor and a level shift resistor is connected between a power supply and the ground. A common connection point between the driving resistor and the level shift resistor is connected to an input terminal of the multiplexer.

4 Claims, 6 Drawing Sheets

VOLTAGE MEASURING SYSTEM

CROSS-REFERENCE TO RELATED APPLICATIONS

The present application is a U.S. national phase of International Application No. PCT/JP2017/030926 filed on Aug. 29, 2017 and is based on Japanese Patent Application No. 2016-218943 filed on Nov. 9, 2016, the contents of which are incorporated herein by reference.

TECHNICAL FIELD

The present disclosure relates to a voltage measuring system for measuring a terminal voltage of a thermistor via a multiplexer.

BACKGROUND

In case of detecting a temperature by a thermistor, a driving resistance element having a low temperature characteristics is connected in series with the thermistor thereby to develop an output by dividing a power supply voltage. In general, the thermistor has poor linearity because its terminal voltage exponentially changes according to a temperature being detected. Therefore, for example, patent document 1 discloses a configuration that improves the linearity by correcting the output voltage of the thermistor by using a memory that stores correction information and logic.

PRIOR ART LITERATURE

Patent Literature

Patent literature 1: JP 2014-102218A

SUMMARY

It is assumed in the configuration disclosed in patent literature 1 that a multiplexer is provided at an input side of an A/D converter 4 to which a terminal voltage is inputted so that other signals may also be A/D converted. In this configuration, when a temperature detected by the thermistor increases, the terminal voltage approaches the ground level. Then an off leakage current arises in the multiplexer and lowers accuracy of a signal inputted to the A/D converter 4.

The present disclosure has an object to provide a voltage measuring system which is capable of preventing deterioration of signal accuracy when a detected temperature increases to a high temperature in case of measuring a terminal voltage of a thermistor through a multiplexer.

According to one aspect of the present disclosure, in a configuration provided with a multiplexer to which signals are inputted from a plurality of sensors including a thermistor, a series circuit including the thermistor, a driving resistor and a level shift resistor is connected between a power supply and the ground. A common connection point between the driving resistor and the level shift resistor is connected to an input terminal of the multiplexer.

With this configuration, a potential at the common connection point is level-shifted. As a result, potential differences between the potential of the common connection point and voltage signals applied to the other input terminals of the multiplexer are reduced. Thus an off leakage current occurring inside the multiplexer is reduced and accuracy of the input signal is prevented from being lowered.

BRIEF DESCRIPTION OF THE DRAWINGS

The above and other objects, features and advantages of the present disclosure will become more apparent from the following detailed description made with reference to the accompanying drawings. In the drawings.

EMBODIMENT

First Embodiment

Figure 1:
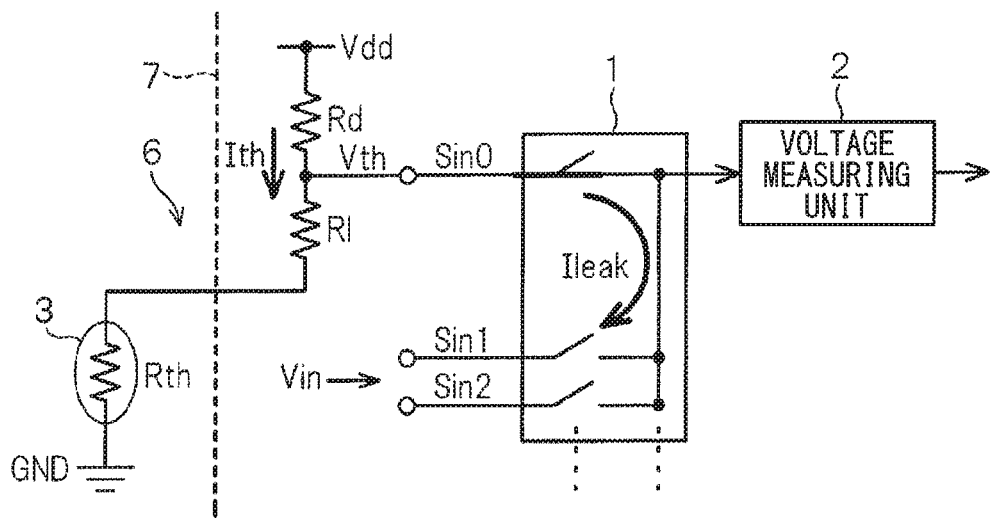
FIG. 1 is a diagram showing a configuration of a voltage measuring system according to a first embodiment.

As shown in FIG. 1, a voltage measuring system according to the present embodiment is configured to input sensor signals outputted from a plurality of sensors selectively to a voltage measuring unit 2 which is, for example, an A/D converter, via a multiplexer 1 and measure signal voltages. One of the plurality of sensors is a thermistor 3. The sensor signal of the thermistor 3 is inputted to an input terminal Sin0 of the multiplexer 1.

The thermistor 3 is connected in series with a driving resistor Rd and a level shift resistor Rl between a power supply Vdd and the ground. These resistors are connected in the order of the driving resistor Rd, the level shift resistor Rl and the thermistor 3 from a power supply Vdd side thereby providing a series circuit 6. A common connection point of the resistor Rd and the resistor Rl is connected to the input terminal Sin0. Sensor signals from other sensors, which are not shown, are inputted to other input terminals Sin1, Sin2 and the like of the multiplexer 1. It is to be noted that components other than the thermistor 3 are configured as an internal circuit of an IC 7 and the thermistor 3 is externally attached to the IC 7.

The level shift resistor Rl is inserted to level-shift a terminal voltage of the thermistor 3 which divides a power supply voltage. Since the thermistor 3 exhibits a negative temperature characteristic in general, the terminal voltage becomes a level near zero when a detected temperature becomes high. Then, as shown in FIG. 1, a potential difference from a signal voltage Vin of the other sensor becomes large, and a leakage current Ileak flows in the multiplexer 1. For reducing the leakage current Ileak, the level shift resistor Rl is inserted to level-shift the terminal voltage of the thermistor 3.

Figure 2:
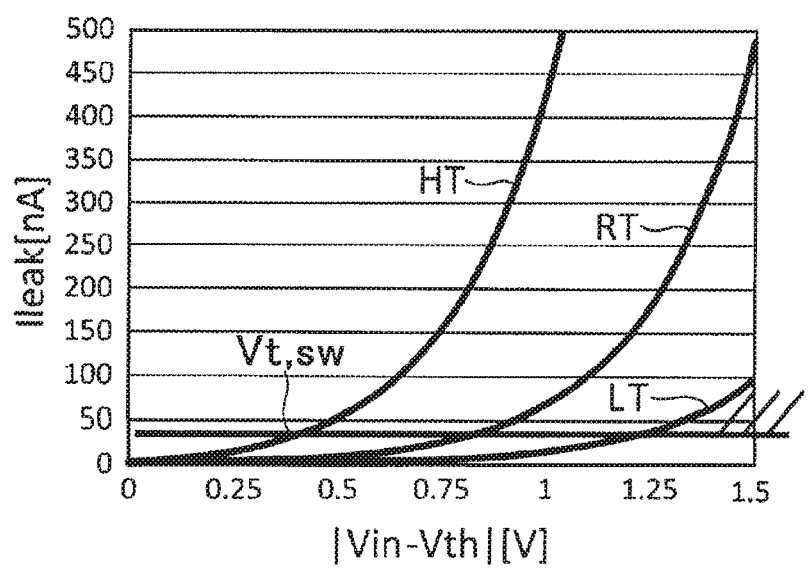
FIG. 2 is a diagram showing an example of an off-leakage current characteristic of a multiplexer.

A resistance value of the level shift resistor Rl is determined as follows. As shown in FIG. 2, assuming that the terminal voltage of the thermistor 3 is Vth, the leakage current Ileak rises exponentially in correspondence to a magnitude of an absolute value |Vin−Vth| of the potential difference. It should be noted that LT, RT and HT shown in the figure correspond to states in which a resistance value of the driving resistor is switched in correspondence to ranges of the temperature detected by the thermistor 3, that is, a low temperature range, a middle temperature range and a high temperature range. However, in the present embodiment, switching of the resistance value of the driving resistor is not assumed.

The voltage value between the input terminals of the multiplexer 1, which exceeds a standard set for off-leakage, is assumed to be Vt,sw. The absolute value |Vin−Vth| of the potential difference is set to be less than the voltage value Vt,sw. As for the voltage Vin, a highest one among the other signal voltages applied to the input terminals of the multiplexer 1 is selected.

$$|Vin-Vth|<Vt,sw \quad (1)$$

Assuming that a current flowing through the series circuit of the thermistor 3 and the resistors Rd and Rl is Ith, the terminal voltage Vth is expressed by the equation (2).

$$Vth=(Rth+Rl)\times Ith \quad (2)$$

Rth is a resistance value of the thermistor 3. In addition, the current Ith is expressed by the equation (3).

$$Ith=Vdd/(Rd+Rl+Rth) \quad (3)$$

The resistance value Rl is determined from the relationships of these expressions (1) to (3).

Specific numerical examples are shown below. For example, it is assumed that Vdd=3.0V, Vin=1.0V, Vt,sw=0.4V, Rth=500Ω, Rd=5 kΩ as those corresponding to the high temperature region HT.

From equation (3), Ith=3/(5.5 k+Rl)
From equation (2), Vth=(500+Rl)×Ith=3×(500+Rl)/(5.5 k+Rl)
From equation (1), 1−3×(500+Rl)/(5.5 k+Rl)<0.4, and 0.6<3×(500+Rl)/(5.5 k+Rl)
∴R1>750Ω

As described above, according to the present embodiment, in the configuration in which the signal voltage is measured by the voltage measuring unit 2 via the multiplexer 1 to which signals from a plurality of sensors including the thermistor 3 are inputted, the series circuit 6 including the thermistor 3, the driving resistor Rd and the level shift resistor Rl is provided between the power source and the ground. The common connection point between the driving resistor Rd and the level shift resistor Rl is connected to the input terminal Sin0 of the multiplexer 1.

With such a configuration, the potential of the common connection point is level-shifted by the resistor Rl. As a result, the potential difference between the potential Vth of the common connection point and the signal voltage Vin applied to the other input terminal of the multiplexer 1 is reduced. Therefore, it is possible to reduce the off leakage current generated inside the multiplexer 1 and to prevent deterioration of the accuracy of the input signal.

Second Embodiment

Figure 3:
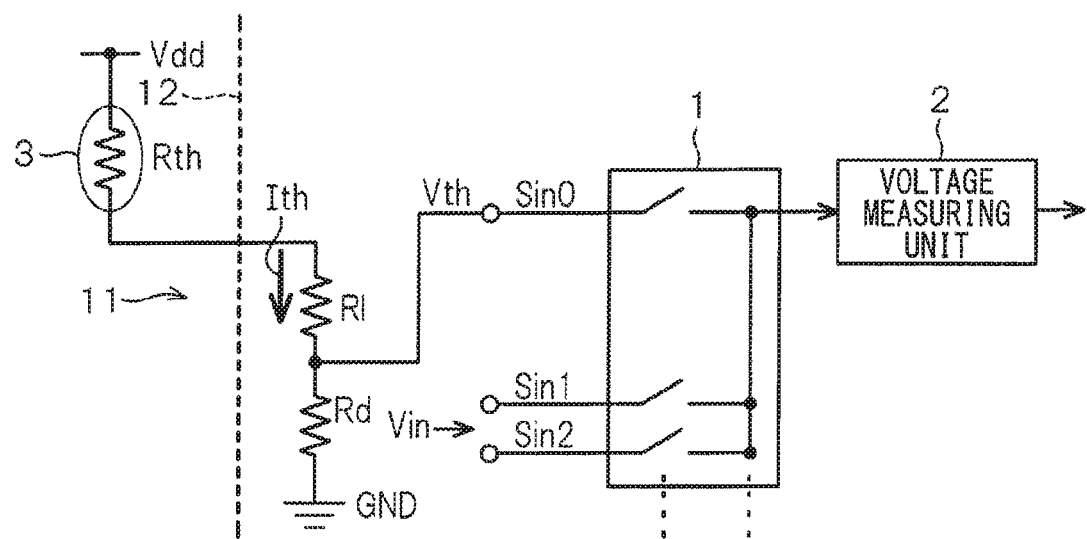
FIG. 3 is a diagram showing a configuration of a voltage measuring system according to a second embodiment.

Hereinafter, the same components as those in the first embodiment will be designated by the same reference numerals thereby to simplify the following description and only differences will be described. In the series circuit 6 of the first embodiment, the driving resistor Rd, the level shift resistor Rl and the thermistor 3 are connected in this order from the power supply Vdd side. In a second embodiment, as shown in FIG. 3, the thermistor 3, the driving resistor Rd and the level shift resistor Rl are connected in this order from the power supply Vdd side thereby to form a series circuit 11. The common connection point of the resistor Rd and the resistor Rl is connected to the input terminal Sin0 of the multiplexer 1. Other components than the thermistor 3 are configured inside an IC 12.

In this configuration, for determining the resistance value R1 of the level shift resistor Rl, the following equation (4) may be used instead of the equation (2).

$$Vth=Vdd-(Rth+Rl)\times Ith \quad (4)$$

According to the second embodiment configured as described above, even when one end of the thermistor 3 is connected to the power supply Vdd, the same effect as in the first embodiment can be provided.

Third Embodiment

In a third embodiment, in order to improve linearity of an output voltage, the resistance value of the driving resistor is switched over in accordance with a temperature range detected by the thermistor 3. Further, the configuration of the third embodiment is provided with a current correction unit for suppressing fluctuation of the power supply voltage generated upon switching over of the resistance value.

Figure 4:
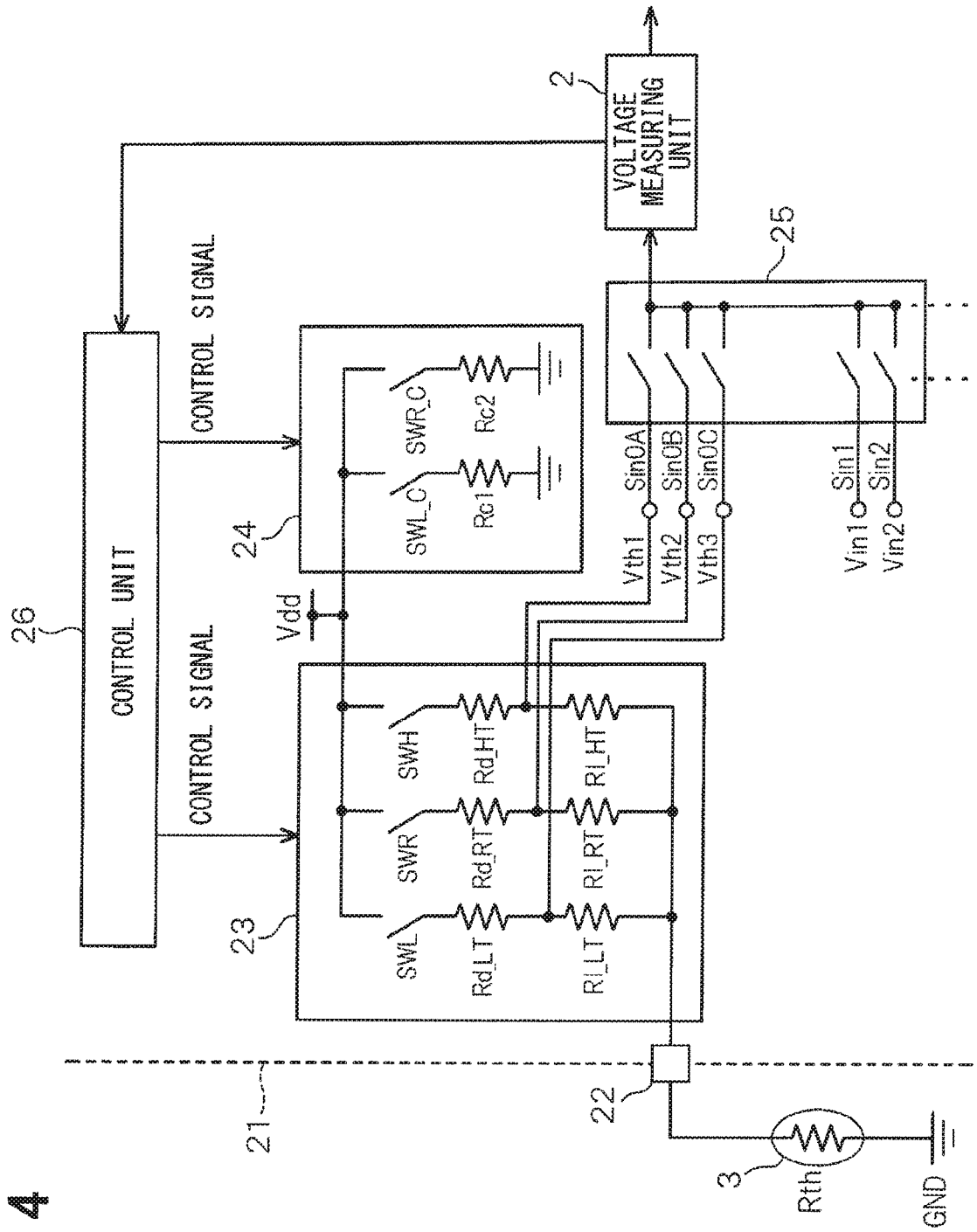
FIG. 4 is a diagram showing a configuration of a voltage measuring system according to a third embodiment.

As shown in FIG. 4, the thermistor 3 is connected between an input terminal 22 of an IC 21 and the ground. Between the power supply Vdd and the input terminal 22, three series circuits including three switches SWL, SWR and SWH, driving resistors Rd_LT, Rd_RT and Rd_HT, level shift resistors Rl_LT, Rl_RT and Rl_HT, respectively, are connected inside the IC 21. These three series circuits form a driving circuit unit 23. Further, two series circuits of switches SWL_C and SWR_C and corresponding current correction resistors Rc1 and Rc2 are connected between the power supply Vdd and the ground. These two series circuits form a current correction unit 24.

Common connection points between the resistors Rd_LT, Rd_RT and Rd_HT and the resistors Rl_LT, Rl_RT and Rl_HT are connected to input terminals Sin0A, Sin0B and Sin0C of a multiplexer 25, respectively. An output terminal of the multiplexer 25 is connected to the input terminal of the voltage measuring unit 2. The voltage measuring unit 2 measures voltages of sensor signals Vth1, Vth2 and Vth3 of the thermistor 3 and other sensor signals Vin1, Vin2 and the like which are selectively inputted via the multiplexer 25. The voltage measuring unit 2 outputs a measured voltage value externally and inputs it into a control unit 26. The control unit 26 switches over each switch of the driving circuit unit 23 and the current correction unit 24 according to voltage data inputted from the voltage measuring unit 2.

Next, operation of the third embodiment will be described. The resistance value of the thermistor 3 has a negative temperature characteristic which decreases exponentially as the temperature to be detected rises. For improving the linearity of the output voltage based on this temperature characteristic, the control unit 26 selectively switches over the driving resistors Rd_LT, Rd_RT and Rd_HT connected to the thermistor 3 according to the temperature range detected by the thermistor 3. The level shift resistors Rl_LT, Rl_RT and Rl_HT are also switched over in correspondence to the switching over of the driving resistors. For example, the temperature range is divided into the following three ranges.

Lower than −5° C.: low temperature range LT
Between −5° C. and 60° C.: middle temperature range RT
Higher than 60° C.: high temperature range HT In the low temperature range LT, only the switch SWL is closed and the resistors Rd_LT and Rl_LT are connected to the thermistor 3. The multiplexer 25 selects the input terminal Sin0C. In the middle temperature range RT, only the switch SWR is closed and the resistors Rd_RT and Rl_RT are connected to the thermistor 3. The multiplexer 25 selects the input terminal Sin0. In the high temperature range LT, only the switch SWH is closed and the resistors Rd_HT and Rl_HT are connected to the thermistor 3. The multiplexer 25 selects the input terminal Sin0A.

As described above, when the resistors of the driving circuit unit 23 is switched over, the amount of the power supply current to be supplied to the thermistor 3 largely fluctuates accordingly, so that the power supply voltage also fluctuates greatly. Therefore, in the third embodiment, the connection state of the current correction resistors Rc1 and Rc2 in the current correction unit 24 is also switched over to suppress the fluctuation amount of a power supply current due to the connection switching described above.

In the high temperature range HT, only the switch SWH is closed as described above. In the middle temperature range RT, the switch SWR is closed and the switch SWR_C of the current correction unit 24 is closed so that the resistor Rc2 is connected between the power supply and the ground. Thus, fluctuation of a power supply current before and after switching from the high temperature range HT to the middle temperature range RT is suppressed. In the low temperature range LT, by closing the switch SWL and closing the switch SWL_C of the current correction section 24 and connecting the resistor Rc1 between the power supply and the ground, the fluctuation of the power supply current flowing before and after switching from the middle temperature range RT to the low temperature range LT is suppressed similarly.

These are the same when the detected temperature shifts from the low temperature range to the high temperature range. Further, the fluctuation of the power supply current is suppressed between before and after the switching from the low temperature range LT to the middle temperature range RT and from the middle temperature range RT to the high temperature range HT. That is, the opening and closing of the switch SWL_C is performed in switching between the RT/LT modes, and the opening and closing of the switch SWR_C is performed in switching between the HT/RT modes.

As described above, according to the third embodiment, three driving resistors Rd_LT, Rd_RT and Rd_HT are provided and are configured to be selectively connectable to the thermistor 3. Further, for changing the series resistance value between the power supply, which includes the thermistor 3 and the driving resistor Rd, and the ground, the control unit 26 is provided. The control unit 26 switches over connection state of the current correction resistors Rc1 and Rc2 in correspondence to switching over the connection state of the current correction resistors Rc1 and Rc2, which are selectively connected, and the connection state of the resistors Rd_LT, Rd_RT and Rd_HT, which are switched over in correspondence to the terminal voltage Vth of the thermistor 3.

Thus, to improve the linearity of the terminal voltage Vth, fluctuations in the power supply current arising when the resistance value of the driving resistor Rd is switched over in correspondence to the temperature range detected by the thermistor 3 is suppressed, and the voltage fluctuation of the power supply Vdd can be suppressed.

Fourth Embodiment

Figure 5:
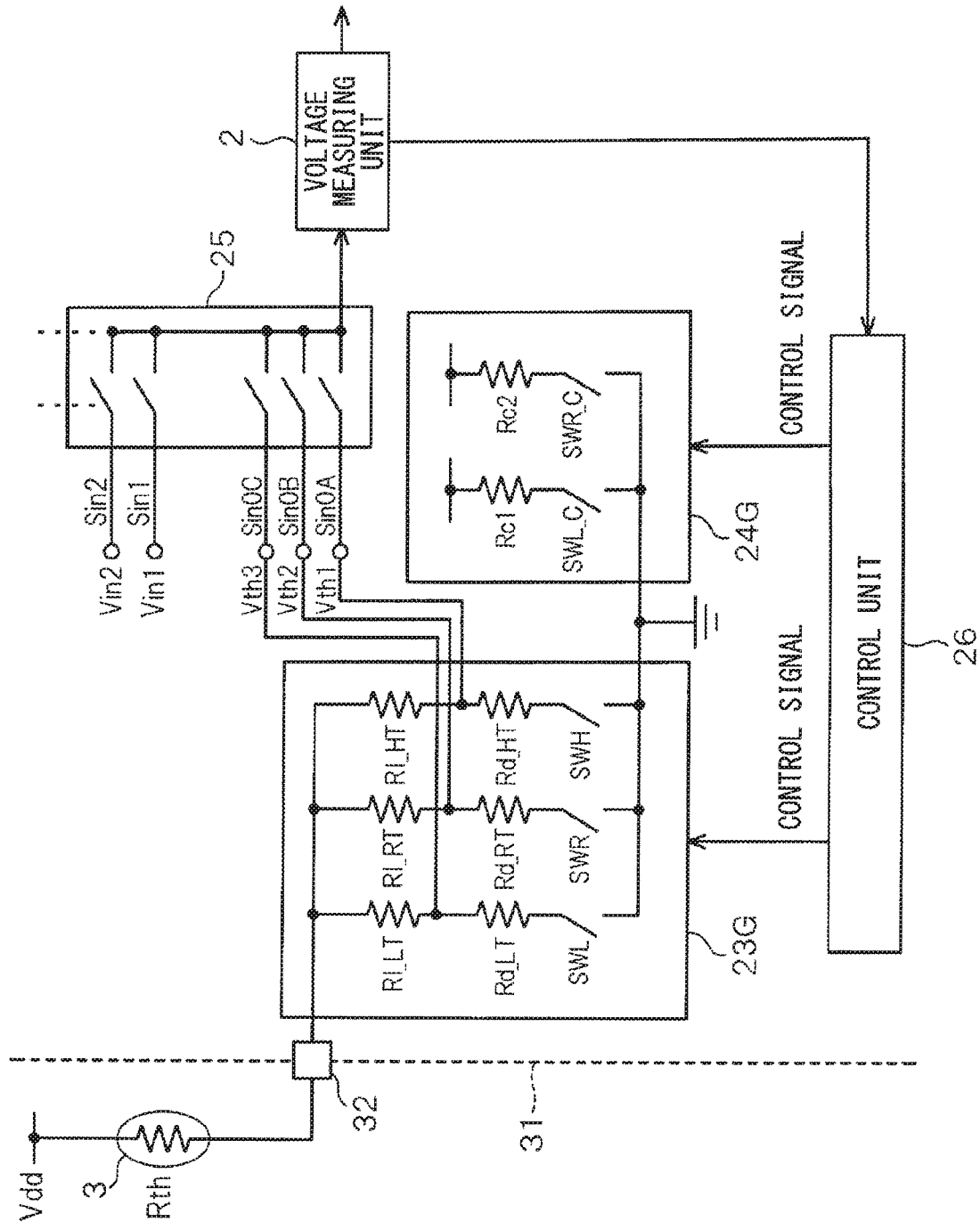
FIG. 5 is a diagram showing a configuration of a voltage measuring system according to a fourth embodiment.

In a fourth embodiment, as shown in FIG. 5, the thermistor 3 is connected between the power supply Vdd and an input terminal 32 of an IC 31. That is, as in the second embodiment, the configuration of the third embodiment is applied in a case that one end of the thermistor 3 is connected to the power supply Vdd. In FIG. 5, a driving circuit unit connected between the input terminal 32 and the ground is indicated by numeral 23G, and a current correction unit in which the switch SW_C is connected to the ground side and the current correction resistor Rc is connected to the power source side is indicated by numeral 24G. The current correction unit 24G has substantially the same configuration as the current correction unit 24 of the third embodiment.

According to the fourth embodiment configured as described above, the configuration of the third embodiment may be applied in a case that one end of the thermistor 3 is connected to the power supply Vdd.

Fifth Embodiment

Figure 6:
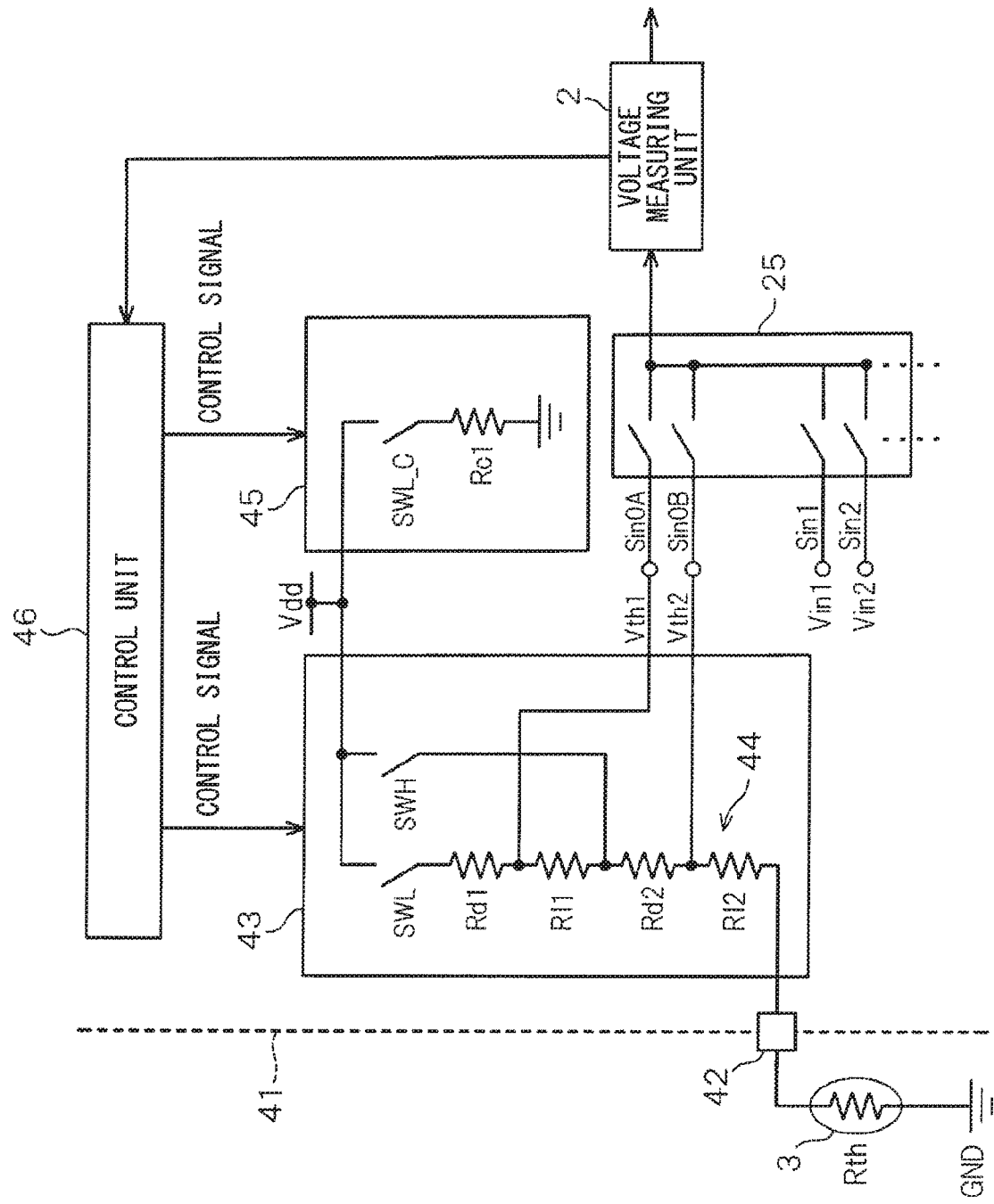
FIG. 6 is a diagram showing a configuration of a voltage measuring system according to a fifth embodiment.

In a fifth embodiment, the temperature range detected by the thermistor 3 is divided into two ranges, for example, a high temperature range HT and a low temperature range LT with a threshold value of 30° C. As shown in FIG. 6, a driving circuit unit 43 inside an IC 41 includes a switch SWL, a driving resistor Rd1, a level shift resistor Rl1, a driving resistor Rd2, a level shift resistor Rl2 are connected in series between the power supply Vdd and an input terminal of the IC 41. These form a series circuit 44.

A common connection point of the resistors Rd1 and Rl1 and a common connection point of the resistors Rd2 and Rl2 are connected to the input terminals Sin0A and Sin0B of the multiplexer 25, respectively. The switch SWH is connected between the power supply Vdd and the common connection point of the resistors Rl1 and Rd2. A current correction unit 45 includes only a series circuit of the switch SWL_C and the current correction resistor Rc1.

Next, operation of the fifth embodiment will be described. When the temperature detected by the thermistor 3 belongs to the high temperature range HT, the control unit 46 closes the switch SWH. Thus, a high-potential end of the driving resistor Rd2 is connected to the power supply Vdd. In addition, the multiplexer 25 selects the input terminal Sin0B and inputs the signal Vth2 appearing at the common connection point of the resistors Rd2 and Rl2. At this time, the driving resistor Rd1 and the level shifting resistor Rl1 which are positioned on the power supply side from the common connection point serve as a driving resistor, and the driving resistor Rd2 and the level shift resistor Rl2 which are positioned on the ground side from the common connecting point serves as a level shift resistor.

When the temperature detected by the thermistor 3 belongs to the low temperature range LT, the control unit 46 closes the switch SWL and connects the high-potential end of the driving resistor Rd 1 to the power source Vdd. In addition, the multiplexer 25 selects the input terminal Sin0A and inputs the signal Vth1 appearing at the common connection point of the resistors Rd1 and Rl1. At this time, in addition to the level shift resistor Rl1, the driving resistor Rd2 and the level shift resistor Rl2 are also used as the level shift resistor. At this time, the control unit 46 closes the switch SWL_C of the current correction unit 45 and connects the current correction resistor Rc1 between the power supply Vdd and the ground.

As described above, according to the fifth embodiment, the series circuit 44 includes four elements of resistors Rd1, Rl1, Rd2 and the resistor R12. The control unit 46 is configured to selectively connect the common connection point of the two resistors Rd1 and Rl1 or the common connection point of the resistors Rd2 and Rl2 in the series circuit 44 to the input terminals Sin0A or Sin0B of the multiplexer 25 and also selectively connect the terminal which is located on the power supply side from the common connection point to the power supply Vdd.

With this configuration, the resistor between the power supply Vdd and the input terminal Sin0A or Sin0B can be used as the driving resistor, and the resistance between the input terminal Sin0A or Sin0B and the thermistor 3 can be used as the level shift resistor.

Sixth Embodiment

Figure 7:
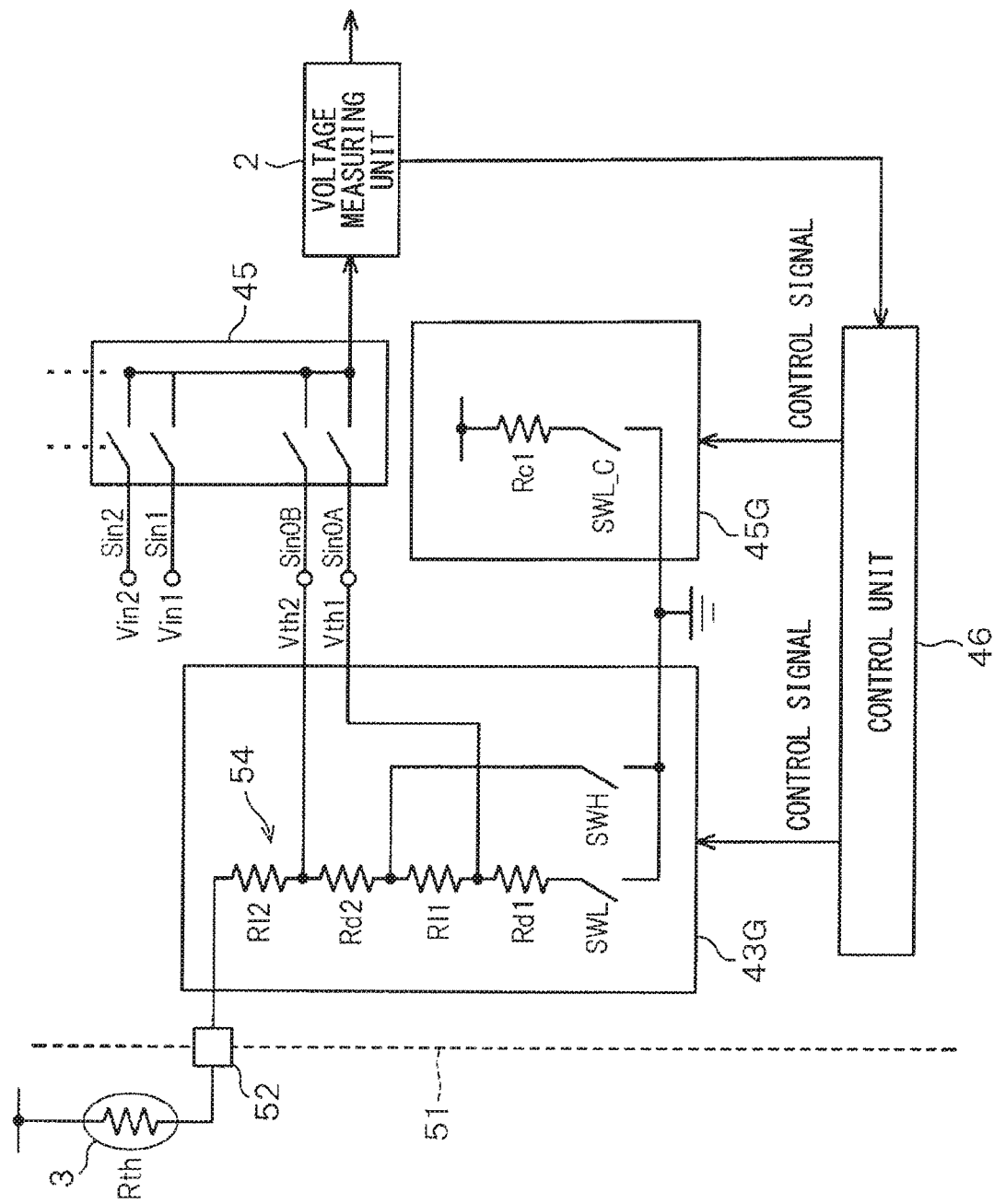
FIG. 7 is a diagram showing a configuration of a voltage measuring system according to a sixth embodiment.

In a sixth embodiment shown in FIG. 7, the thermistor 3 is connected between the power supply Vdd and an input terminal 52 of an IC 51. That is, as in the second embodiment, the configuration of the fifth embodiment is applied in case that one end of the thermistor 3 is connected to the power supply Vdd. In FIG. 7, a driving circuit unit connected between the input terminal 52 and the ground is indicated by numeral 43G, and a current correction unit in which the switch SWL_C is connected to the ground side and the current correction resistor Rc1 is connected to the power supply side is indicated by numeral 45G.

According to the sixth embodiment configured as described above, the configuration of the fifth embodiment can be applied to the configuration in which one end of the thermistor 3 is connected to the power source Vdd.

Other Embodiments

The third or fourth embodiment may be applied to two temperature ranges as in the fifth or sixth embodiment or may be applied to four or more temperature ranges.

In the fifth or sixth embodiment, the number of resistance elements of the series circuit may be "3" or "5" or more, and the series circuit may be applied to three or more temperature ranges as in the third or fourth embodiment.

Although the present disclosure has been made in accordance with the embodiments, it is understood that the present disclosure is not limited to such embodiments and structures. The present disclosure covers various modification examples and equivalent arrangements. Furthermore, various combinations and formations, and other combinations and formations including one or more than one or less than one element may be included in the scope and the spirit of the present disclosure.

The invention claimed is:

1. A voltage measuring system comprising:
a multiplexer to which signals are inputted from a plurality of sensors including a thermistor;
a voltage measuring unit for measuring voltages of signals inputted through the multiplexer; and
a series circuit connected between a power supply and a ground and including the thermistor, a driving resistor and a level shift resistor,
wherein a common connection point between the driving resistor and the level shift resistor is connected to an input terminal of the multiplexer,
the series circuit includes a plurality of driving resistors which are selectively connectable to the thermistor;
at least one current correction resistor is provided to be selectively connectable for changing a series resistance value of the thermistor and the driving resistors between the power supply and the ground; and
a control unit is provided for switching over a connection state of the current correction resistor at time of switching over a connection state of the plurality of driving resistors in correspondence to a terminal voltage of the thermistor.

2. The voltage measuring system according to claim 1, wherein:
the series circuit includes three or more resistors,
one end of the thermistor is connected to the ground, and
a level shift control unit is provided for switching over a selective connection of the common connection point of two resistors in the series circuit to the input terminal of the multiplexer and a selective connection of a terminal, which is provided on a more power supply side than the common connection point, to the power supply.

3. The voltage measuring system according to claim 1, wherein:
the series circuit includes three or more resistors;
one end of the thermistor is connected to the power supply; and
a level shift control unit is provided for switching over a selective connection of the common connection point of two resistors in the series circuit to the input terminal of the multiplexer and a selective connection of a terminal, which is provided at a more ground side than the common connection point, to the ground.

4. A voltage measuring system comprising:
a thermistor having one end connected to one of a power supply and a ground and varying a resistance value thereof with temperature;
a driving circuit unit connected in series with the thermistor between the power supply and the ground and including at least two resistors connected in series with the thermistor, the driving circuit unit generating a voltage variable with the resistance value of the thermistor from a common connection point between the at least two resistors;
a multiplexer for selecting one of voltages including the voltage generated at the common connection point;
a voltage measuring unit connected to the multiplexer for measuring the voltage applied through the multiplexer;
a current correction circuit unit connected between the power supply and the ground and including at least one resistor; and
a control unit connected to the driving circuit unit and the current correction circuit unit for switching over both of a resistance value of the driving circuit unit and a resistance value of the current correction circuit unit when a temperature indicated by the voltage measured by the voltage measuring unit reaches a predetermined threshold value, thereby suppressing fluctuation of a current flowing to the thermistor by the current correction circuit unit at a time of switching over of the resistance value of the driving circuit unit.

* * * * *